United States Patent [19]
Wampler et al.

[11] Patent Number: 5,663,893
[45] Date of Patent: Sep. 2, 1997

[54] METHOD FOR GENERATING PROXIMITY CORRECTION FEATURES FOR A LITHOGRAPHIC MASK PATTERN

[75] Inventors: Kurt E. Wampler, Sunnyvale; Thomas L. Laidig, Richmond, both of Calif.

[73] Assignee: MicroUnity Systems Engineering, Inc., Sunnyvale, Calif.

[21] Appl. No.: 433,730

[22] Filed: May 3, 1995

[51] Int. Cl.$^6$ .............................. G03F 7/00; H01J 37/302
[52] U.S. Cl. .................... 364/491; 264/490; 382/144; 382/199; 378/34; 430/5
[58] Field of Search ............................. 395/500; 364/488, 364/491, 490; 382/144, 199, 203; 378/34, 35; 430/5, 296, 311

[56] References Cited

U.S. PATENT DOCUMENTS

| | | | |
|---|---|---|---|
| 4,504,558 | 3/1985 | Bohlen et al. | 430/30 |
| 4,717,644 | 1/1988 | Jones et al. | 430/296 |
| 5,082,762 | 1/1992 | Takahashi | 430/296 |
| 5,241,185 | 8/1993 | Meiri et al. | 250/492.2 |
| 5,242,770 | 9/1993 | Chen et al. | 430/5 |
| 5,251,140 | 10/1993 | Chung et al. | 364/474.02 |
| 5,294,800 | 3/1994 | Chung et al. | 250/492.2 |
| 5,432,714 | 7/1995 | Chung et al. | 364/525 |
| 5,447,810 | 9/1995 | Chen et al. | 430/5 |
| 5,475,766 | 12/1995 | Tsuchiya et al. | 382/144 |

OTHER PUBLICATIONS

Harafyi et al., "A Novel Hierachical Approach for Proximity Effect Correction in Electronic Beam Lithography", IEEE 1993, pp. 1508–1514.
Van den hove et al., "Optical Lithography Techniques for 0.28 μm and Below: CD control issues", IEEE 1995, pp. 24–30.
Garofalo et al., "Automatic Proximity Correction for 0.35 μm 1–line Photolithography", IEEE 1994, pp. 92–94.
Starikor, "Use of a single size square serif for variable print bias copensation in microlithography: method, design, and practice", SPIE, 1989, pp. 34–46.
Starikov, "Use of a Single Size Square Serif for Variable Print Bias Copensation in Microlithography: Method, Design, and Practice", The International Society for Optical Engineering, pp. 34–36.

*Primary Examiner*—Kevin J. Teska
*Assistant Examiner*—Tan Nguyen
*Attorney, Agent, or Firm*—Burns, Doane, Swecker & Mathis, L.L.P.

[57] ABSTRACT

A method for synthesizing correction features for an entire mask pattern that initially divides mask pattern data into tiles of data—each tile representing an overlapping section of the original mask pattern. Each of the tiles of data is sequentially processed through correction feature synthesis phases—each phase synthesizing a different type of correction feature. All of the correction features are synthesized for a given tile before synthesizing the correction features for the next tile. Each correction feature synthesis phase formats the data stored in the tile into a representation that provides information needed to synthesize the correction feature for the given phase. Methods for implementing edge bar and serif correction features synthesis phases are also described. The method for synthesizing external type edge bars is performed by oversizing feature data in the tile by an amount equal to the desired spacing of the external edge bar, formatting the oversized data into an edge representation and expanding each of the edges in the edge representation of the oversized data into edge bars having a predetermined width. Internal type of edge bars for the tile are synthesized by initially inverting feature data and then performing the same steps as for generating the external edge bars. The method for serif synthesis is performed by initially formatting tile data into a vertex representation, eliminating certain of the vertices not requiring serifs, synthesizing a positive serif for each convex corner and a negative vertex for each concave corner, and eliminating any disallowed serifs. Internal bars and negative serifs are "cut-out" of original tile data by performing geometric Boolean operations and external bars and positive serifs are concatenated with the "cut-out" tile data, equivalent to performing a geometric OR operation.

15 Claims, 7 Drawing Sheets

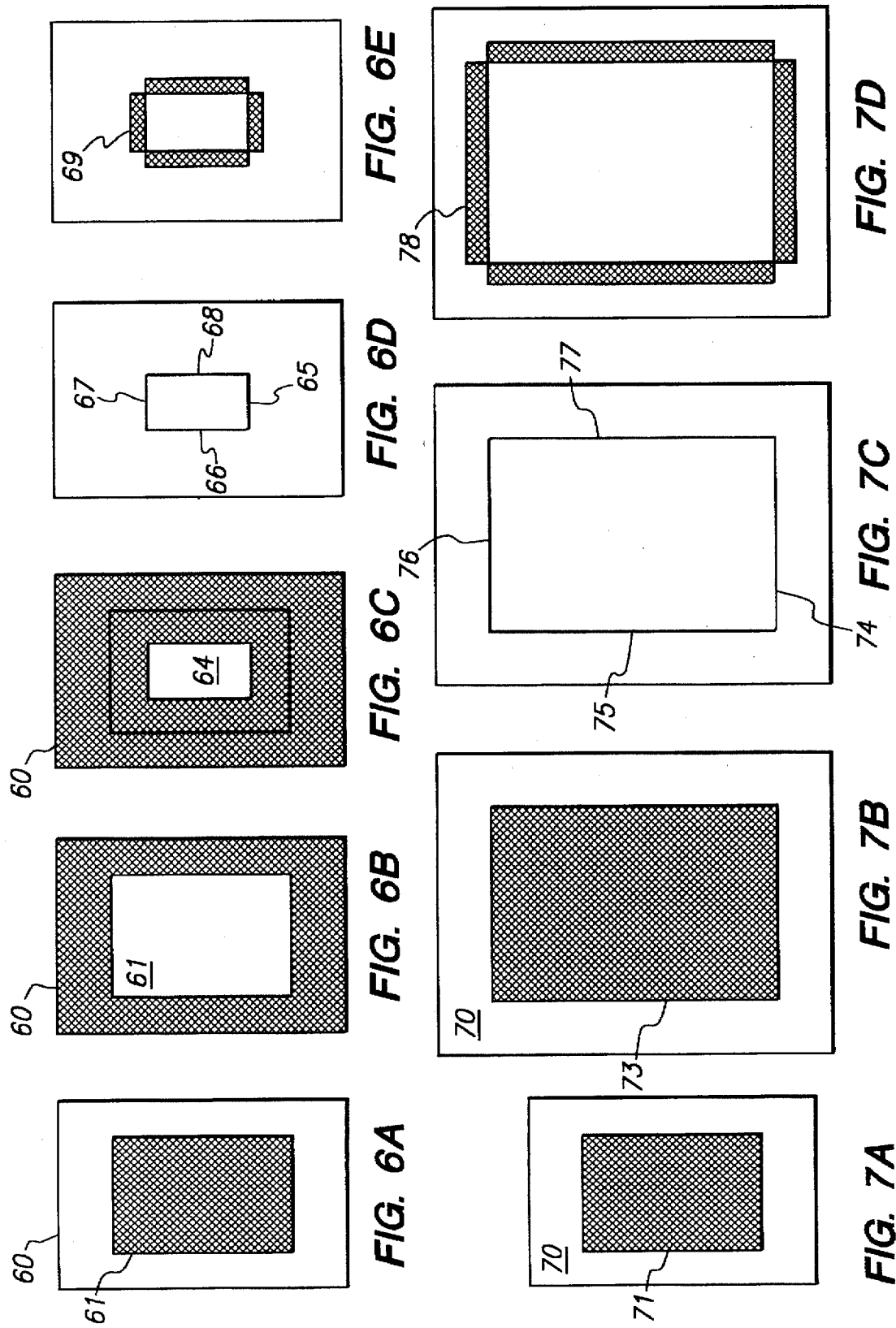

METHOD FOR GENERATING PROXIMITY CORRECTION FEATURES FOR A LITHOGRAPHIC MASK PATTERN

FIELD OF THE INVENTION

The present invention relates to the field of photolithography, and more particularly to generating proximity correction features in a lithographic mask pattern.

BACKGROUND OF THE INVENTION

In the field of semiconductor fabrication, lithographic masks are used to transfer patterns to silicon wafers to create integrated circuits. When designers initially create a mask pattern, the program code or data describing the pattern is entered into a computer aided design (CAD) tool. This pattern data is usually represented in a condensed hierarchical fashion. At the higher levels of pattern representation hierarchy, features are represented in a conceptual manner. For instance, a memory array may be described as having a given cell repeated for a certain number of rows and columns. The next lower level in the hierarchy might describe the basic memory cell, comprised of subcells A and B. Finally, at the lowest level, the most primitive subcells contain geometric primitives—rectangles and polygons.

In order to generate a mask, the hierarchical data must first be flattened, enumerating every geometric instance described in the hierarchy, and then fractured. Fracturing is a technique that transforms pattern data described in terms of polygons into data that is represented in terms of rectangles and/or trapezoids. For instance, a u-shaped polygon in the "flattened data" is broken down into three component rectangles when fractured. Geometric data before fracturing can be represented in different manners. One representation may describe each rectangle or polygon in terms of vertex locations (referred to as vertex representation). Another manner in which rectangles or polygons can be represented is with a list of edges—where each edge is described in terms of the location of its end points. Flattening of the hierarchy typically results in several orders of magnitude increase in the size of data storage required to represent the pattern.

In the continuing drive to reduce the size of integrated circuits, dealing with proximity effects and other undesirable effects that occur when mask pattern feature sizes approach lithographic tool resolution limits has become crucial. U.S. Pat. No. 5,256,505 and U.S. Pat. No. 5,242,770, both assigned to the assignee of the present invention, describe mask techniques used to compensate for proximity effects in lithographic processing. Each of U.S. Pat. No. 5,256,505 and U.S. Pat. No. 5,242,770 utilize additional sub-lithographic features (i.e. features having critical dimensions less than the resolution of the exposure tool) in order to compensate for proximity effects. The additional proximity correction features in the mask pattern described by U.S. Pat. No. 5,242,770, (referred to as leveling bars), affect the edge intensity gradients of certain features within the mask pattern to compensate for proximity effects. U.S. Pat. No. 5,256,505 describes a mask that utilizes intensity modulation lines within the features to reduce the intensity levels for specific features within the mask pattern. Still another method employed to compensate for proximity effects and to improve lithographic pattern transference is described in U.S. patent application Ser. No. 08/194,097, also assigned to the assignee of the present invention. This mask pattern technique adds sub-lithographic features, referred to as scattering bars and anti-scattering bars, to mask patterns to reduce differences between features within a mask pattern due to proximity effects. One other common lithographic practice used to improve pattern transference is to add features, referred to as "serifs", to the corners of mask pattern features. Serifs are sub-lithographic square-shaped features positioned on each corner of a feature and serve to sharpen corners in the final transferred image.

Although adding all or several of the above sub-lithographic features to every feature in a mask pattern is optimal, the addition of all of these optical proximity effect correction features to a mask pattern can result in an order-of-magnitude increase in the total feature count in the mask pattern. For instance, adding a serif to each of the corners of a square (four serifs) and a scattering bar along each edge (four scattering bars) increases from 1 to 9 the number of features required to represent a single square.

In addition, in order to add a correction feature to every feature in a mask pattern, it is necessary first to reduce the mask pattern data to a non-hierarchical format. Every instance of each geometric feature described in the hierarchy must first be enumerated in order to reveal all interactions (overlaps, close proximity situations) between features before correction features can be properly computed. Consequently, the process of adding correction feature data to every feature in a pattern formatted in a non-hierarchical representation involves processing enormous amounts of data.

Another problem with adding correction features to each feature in a mask pattern is that different information is needed to generate each type of correction feature. For instance, in generating serifs it is useful to know vertex location. Thus, for serif generation, it is optimal to have the original mask pattern data represented as vertices. On the other hand, to generate and add proximity correction bars (e.g. scattering bars) to adjacent edges of features, it is necessary to have the pattern data represented as edges. Other types of correction features require rectangular representation or a polygonal representation. However, no current pattern generation software is able to represent geometric data as both edges and vertices, making the computation of serifs and scattering bars impossible with existing tools, or at best, prohibitively expensive because of computation time and memory requirement.

Scanning electron beam or laser imaging systems utilize the mask pattern data in its flattened representation to manufacture high-resolution photolithography masks for the integrated circuit. Consequently, hierarchical data needs to be flattened before the mask imaging system can use it. Presently employed commercial mask pattern fracturing software is designed to deal with incoming feature data that is represented hierarchically. As such, these commercial packages are not well equipped to manipulate large amounts of non-hierarchical input data in order to generate correction features. In addition, although some of the fracturing products are capable of adjusting pattern size (referred to as a grow or shrink function) and can perform simple geometric Boolean logic functions such as (AND, AND-NOT, OR, XOR), they lack the specific capabilities of vertex recognition, edge recognition, and dimensional filtering that are required to properly compute the correction features. Due to these limitations of the commercially available software, the currently practiced method for adding proximity correction features is accomplished by adding features only to selected cells within the mask pattern and then repeating these corrected cells over a given area on the mask. This method is lacking since it does not provide overall proximity correction for all features of the pattern.

The present invention is a method for adding sub-lithographic correction features to all features within an original mask pattern in a time and memory efficient manner.

SUMMARY OF THE INVENTION

The present invention is a method for synthesizing additional lithographic correction features for an entire mask pattern. The method of the present invention initially reformats hierarchical mask pattern data into a non-hierarchical data representation format. This non-hierarchical (flattened) data is then divided into many "tiles" of data—each tile of data representing a section of the original mask pattern. Each tile is sequentially processed through a series of correction feature generation phases—each phase corresponding to a different type of correction feature—to generate all of the correction features for a single given tile at a time.

Each generation phase comprises a series of steps for generating the specific type of correction feature. For each phase, the non-hierarchical data corresponding to one tile is initially reformatted into a representation that provides the information needed to generate the particular type of correction feature. The reformatted tile data is then processed to generate the designated correction features for the tile. All of the exterior-type correction features, i.e. exterior with respect to the feature, are concatenated with the original features in the tile. All interior-type correction features (i.e. cut-outs from original pattern features) are geometrically subtracted from the original tile data to generate modified tile data having interior feature cut-outs. Geometric subtraction is accomplished by performing a geometric AND-NOT operation between the interior type correction features and the original tile data. This modified tile data is used in subsequent correction feature generation phases when adding other interior correction features for that tile.

Once the original tile pattern data has been processed through each of the phases and all of the correction features for the tile are computed, the modified data and exterior correction features are concatenated together and are compacted and stored in the pattern file. The pattern file is stored in secondary memory. Finally, all intermediate data that were used to generate the correction features for that particular tile, e.g. reformatted data, results from Boolean operations, etc. are flushed from primary memory in order to free up this faster memory space for computation of correction features for the next tile. Each tile's data is sequentially retrieved and processed in the same manner as described above until all tiles have been processed for the entire mask pattern.

The present invention also describes methods for implementing two types of pattern generation phases. A first pattern generation phase as described by the present invention is for synthesizing positive and negative serifs and a second pattern generation phase as described by the present invention is for synthesizing external and internal edge bars, referred to as scattering bars.

The serif generation phase includes the steps of reformatting tile pattern data into vertex representation data, eliminating all redundant vertices in order to minimize the number of vertices for that tile, utilizing serif generation mapping software to compute a serif for each vertex, filtering serif data to eliminate serifs spaced illegally close to each other, concatenating computed positive serif data with the pattern file data, and geometrically subtracting the negative serif data from the original data to generate modified tile data having negative serifs.

The edge bar generation phase includes the steps of determining whether the bars being computed are interior or exterior to the original features within the tile, inverting the tile data (i.e. making the dark areas light and the light areas dark) in the case of interior bars, growing each of the original features in the tile by an amount that corresponds to the designated distance at which the edge bar is to be placed, converting the grown data into an edge representation—where each edge is represented by two data points, creating edge bars by expanding each edge a designated edge bar width, filtering bar data to eliminate illegal bars and fragments, concatenating exterior bar features with the pattern file data, and geometrically subtracting interior bar features from the original data to generate modified tile data having interior bar features.

BRIEF DESCRIPTION OF THE DRAWINGS

FIGS. 6A–6E illustrate a feature after performing geometric operations to generate interior scattering bars.

FIGS. 7A–7D illustrate a feature after performing geometric operations to generate exterior scattering bars.

DETAILED DESCRIPTION

Figure 1A:
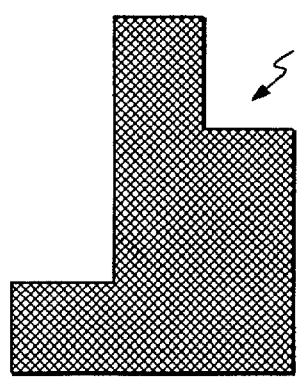
FIG. 1A illustrates a clear field pattern feature.

A method for generating correction features for an entire mask pattern is described. In the following description, numerous specific details are set forth, such as data formatting types, proximity correction feature types, mask design rules, and geometry engine type in order to provide a thorough understanding of the present invention. It will be obvious, however, to one skilled in the art that these specific details need not be employed to practice the present invention. In other instances, well-known lithographic techniques, geometric pattern manipulation techniques, and e-beam mask making technologies have not been described in detail in order to avoid unnecessarily obscuring the present invention.

Photolithographic masks consist of geometric patterns corresponding to the circuit components to be integrated into a silicon wafer. Each mask is used to transfer its corresponding pattern to a photosensitive layer of material (i.e. photoresist) deposited on a silicon substrate.

As the size of an integrated circuit is reduced, the minimum dimension of its corresponding mask pattern approaches the resolution limit of the optical exposure tool (i.e. the optical tool's minimum transferable dimension) being utilized to transfer the pattern. As a result, many pattern transference problems begin to occur. Often times these problems are attributed to phenomena referred to as "proximity effects".

Proximity effects occur when very closely spaced pattern features are lithographically transferred to a resist layer on a wafer. The light waves of the closely spaced features interact and, as a result, distort the final transferred pattern features. Another problem that occurs when feature sizes and spacing approach the resolution limit of the lithographic tool is that corners (concave and convex) tend to overexpose or underexpose due to a concentration or scarcity of energy at each of the corners. Other types of problems, such as over- or under-exposure of small features when large and small features are transferred from the same mask pattern, also occur.

One technique utilized in the photolithography industry to overcome these types of proximity effects is to add additional features to the original mask pattern. These additional features are typically sub-lithographic (i.e. have dimensions less than the resolution of the exposure tool) and thus do not transfer to the resist layer. Instead, they interact with the original pattern so as to improve the final transferred pattern and compensate for proximity effects.

U.S. Pat. No. 5,256,505, U.S. Pat. No. 5,242,770, and pending U.S. patent application Ser. No. 08/194,097 assigned to the assignee of the present invention describe three different types of proximity correction techniques—each adding sub-lithographic proximity correction features to original mask patterns to compensate for proximity effects. Another proximity correction technique that is commonly used in the industry adds sub-lithographic rectilinear shaped features (referred to as serifs) to original feature corners in order to sharpen corner transference.

Figure 1B:
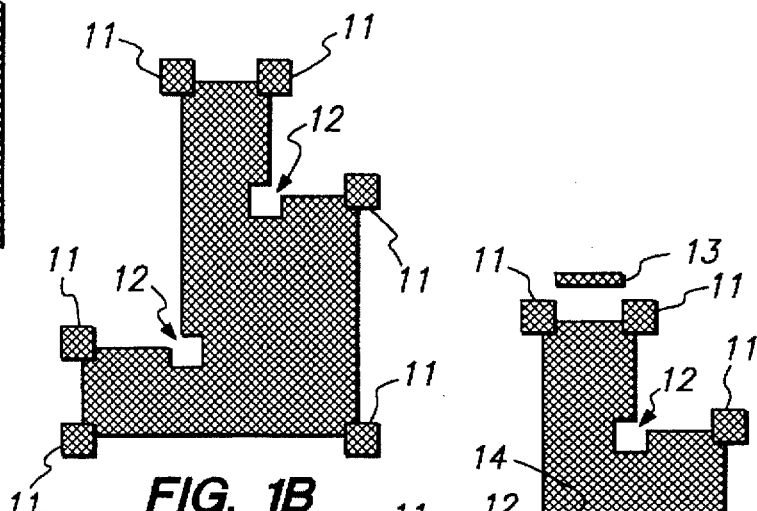
FIG. 1B illustrates the feature shown in FIG. 1A with positive and negative serif correction features.
Figure 1C:
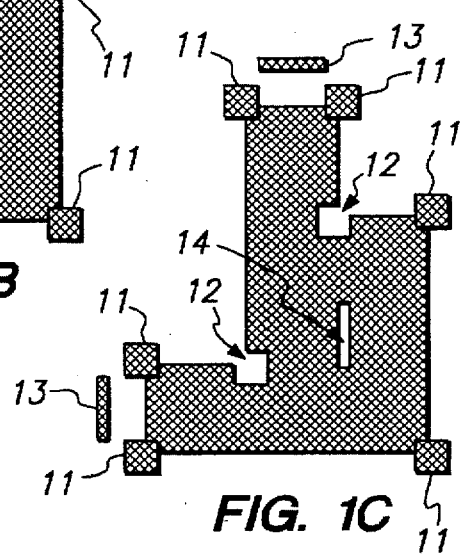
FIG. 1C illustrates the original feature shown in FIG. 1B with interior and exterior edge bar features.

FIG. 1A illustrates a mask pattern feature 10 and FIGS. 1B and 1C illustrate feature 10 after adding some typical optical correction features to it. FIG. 1B illustrates original feature 10 having positive serifs 11 and negative serifs 12 added to it and FIG. 1C illustrates feature 10 having positive and negative serifs (11 and 12) and exterior edge bars 13 and interior edge bars 14 added to it. Design rules determining the width and distance of the edge bars and size and placement of serifs are dependent on many factors relating to the lithographic process utilized.

Adding these optical correction features to original mask pattern data needs to be done when the mask pattern data is formatted such that each feature is enumerated, i.e. a non-hierarchical format. This is necessary in order to have the required information to compute the optical correction features for each individual original feature in the mask pattern.

Non-hierarchical data may be represented in a number of ways. Two representations of interest are edge-based and vertex-based. An edge representation of a particular pattern consists of a list of edges, where each edge is described in terms of the spatial coordinates of its two end points. A vertex representation of the pattern consists of a list of vertices where each vertex is described in terms of its spatial coordinate, type of vertex (i.e. convex or concave), and direction.

When computing and generating correction features, it is optimal to have certain types of information in order to determine the placement and size of the correction feature with respect to the original feature. For instance, in generating serifs, a vertex representation of the original pattern data is more useful than an edge representation since a vertex representation typically gives information about the type of vertex (convex or concave) and its location. Conversely, an edge representation is more useful when generating edge bars since it describes the length and location of the edge. Processing the data for both a non-hierarchical vertex representation and a non-hierarchical edge representation to determine correction features for an entire mask pattern is simply not within the repertoire of currently-available commercial mask data processing software.

The present invention is a unique method for generating more than one type of correction feature for an entire mask pattern while avoiding the memory and processing time limitations that have, heretofore, prevented the development of a commercial solution to this problem. The general concept behind the present invention is to divide the mask pattern data into a number of geometric tiles—each tile containing pattern data corresponding to a section of the original mask pattern. Each individual tile is then processed through a series of correction feature generation phases to generate all of the correction features for that particular tile. The combined original and correction feature data for the tile is then condensed and stored to a secondary memory to free up primary memory for correction feature computation for the next tile of data. New tiles of data are processed through the correction generation phases until all tiles have been processed. In each correction feature phase, the tile data is reformatted into a representation that provides the type of information to generate the particular correction feature for the phase. For instance, in one embodiment, the original tile of pattern data is reformatted into vertex representation when computing serifs. To generate edge bars, the original tile of pattern data is converted to edge representation. Since the amount of data for each tile is small, the reformatting does not result in large processing delay times.

It should be noted that all of the standard geometric data manipulations, geometric computations, and data reformat operations performed in the following steps are performed by a series of utility software routines commonly referred to in the art as a geometry engine. The geometry engine provides a means of performing various operations on geometric pattern data such as pattern sizing (grow/shrink operations), geometric Boolean operations such as AND, OR, XOR, or AND-NOT, and representation conversion.

Figure 2:
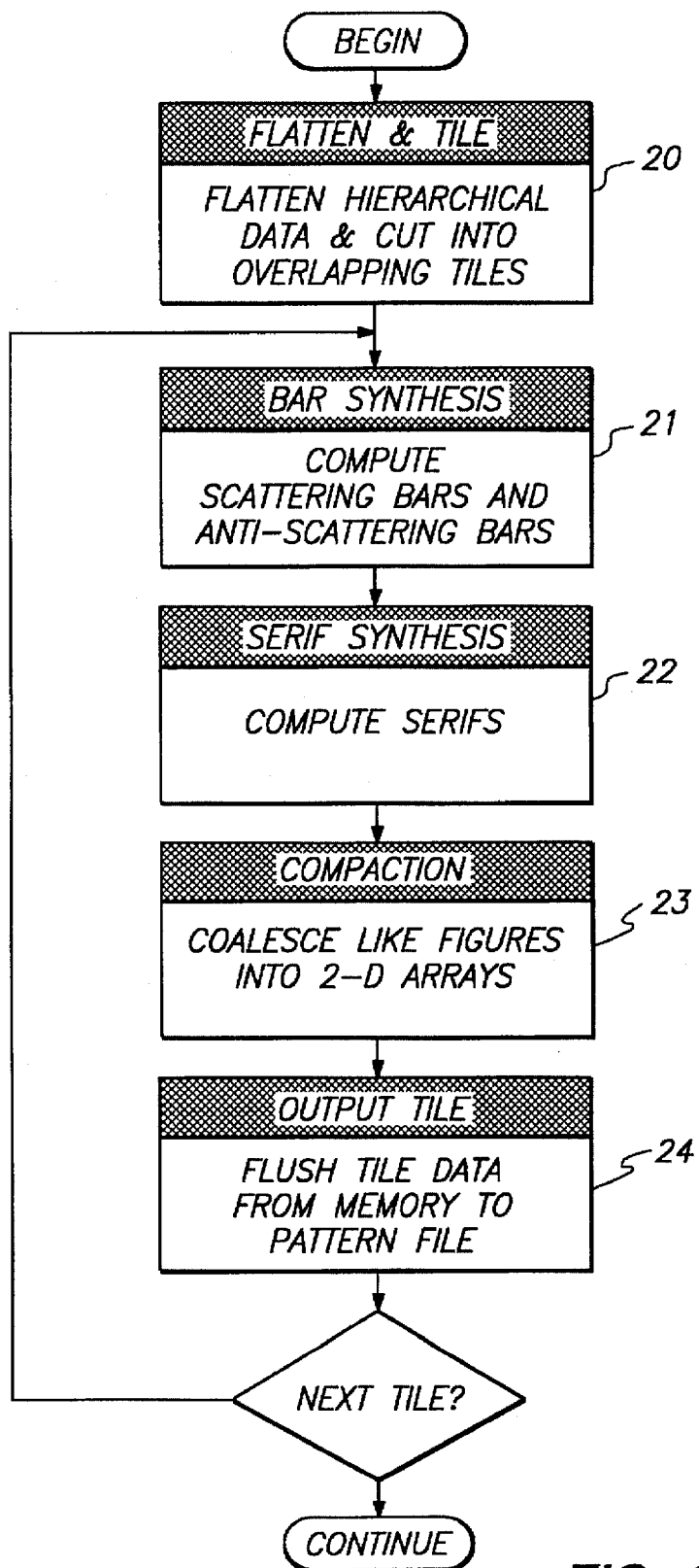
FIG. 2 is a flowchart showing the steps for synthesizing correction features for an entire mask pattern according to one embodiment of the present invention.

FIG. 2 illustrates a flowchart showing the steps of one embodiment of the method of the present invention. Flatten and Tile block 20 (FIG. 2) involves the steps of taking the hierarchical data for the entire mask pattern, expanding it into non-hierarchical form (i.e. flattening the data), and then dividing the flattened data into many geometric sections (i.e. tiles) within the mask pattern.

In this embodiment of the present invention the flattened pattern data is represented in terms of one or more polygons—where each polygon is defined as a closed loop of vertices. It should be apparent that other flattened data formats may also be used. However, whatever the data format, each feature needs to be enumerated at this point.

Figure 3A:
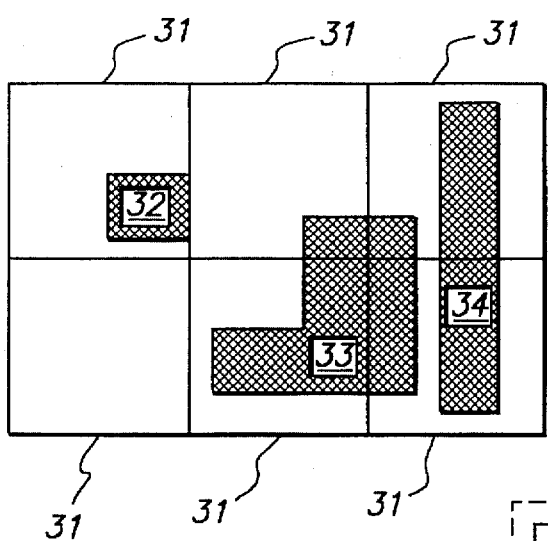
FIG. 3A illustrates a clear field mask pattern divided into six non-overlapping tiles.
Figure 3B:
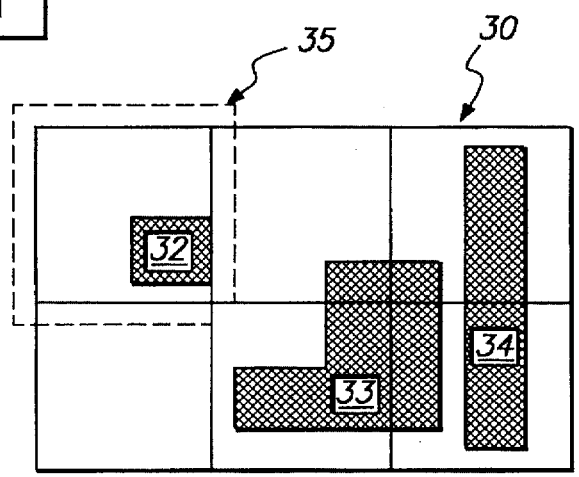
FIG. 3B illustrates an oversized tile with respect to the non-overlapping tile.

After expanding the data to flattened form, it is divided into multiple sections of data (block 20)—each section containing data representing a geometric region (also referred to as a tile) of the entire data pattern. FIG. 3A and 3B illustrate the manner in which a data pattern 30 is divided into many tiles. As shown in FIG. 3A, clear field data pattern 30 consists of features 32–34 and is sectioned into six defined non-overlapping tiles 31. FIG. 3B illustrates the manner in which the data corresponding to a pattern 30 is actually divided in accordance to the method of the present invention. The data for pattern 30 is divided into six overlapping tiles as illustrated by tile 35 in FIG. 3B, (only one overlapping tile 35 is shown in FIG. 3B for clarity). Tiles are overlapped to account for cases in which feature edges reside close to the boundary defined by the non-overlapping tiles 31 (e.g. feature 32, FIG. 3B) or cross over the boundary defined by the non-overlapping tiles 31 (e.g. features 33 and 34, FIG. 3B).

Once the pattern data is divided into overlapping tiles 35, each tile is processed through two correction feature generation phases (blocks 21 and 22, FIG. 2). Block 21 synthesizes scattering bars and anti-scattering bars (as taught by U.S. patent application Ser. No. 08/194,097) for all edges residing within the particular tile being processed. Block 22 performs the serif synthesis for all corners residing within the tile being processed. It should be understood that although blocks 21 and 22 are each associated with a particular type of correction feature, any other type of correction feature may be generated within these blocks. In addition, the number of correction feature generation phases is not limited to only two phases, instead, more phases may be added. Further, the order of generation phases can be different than what is shown in FIG. 2.

Scattering bar generation phase 21 utilizes the original data corresponding to a given tile to generate 1) a data set of computed exterior bars for the tile and 2) a modified data set corresponding to the result of a geometrical subtraction between the data corresponding to the tile's computed interior bars and the original tile data.

Next, serif generation phase 22 utilizes the original data corresponding to the tile to generate: 1) a data file of computed positive serifs and 2) a modified data file corresponding to the result of a geometric subtraction between the modified tile data from the previous block (i.e. block 21) and the data corresponding to the tile's computed negative serifs.

After the second feature generation phase, three data sets have been generated, 1) a set containing data representing a modified pattern having both negative serifs and interior bars, 2) a set containing data representing the positive serifs for the tile and 3) a set containing data representing the exterior bars for the tile. These three sets are concatenated into a single set representing the tile data having all of the correction features applied to it. This single data set is then clipped to the exact size of the original non-overlapping tile, eliminating all redundant and erroneous data in the overlap region.

This data set is then processed through a compaction phase 23. The particular geometry engine employed in the preferred embodiment of the present invention performs compaction phase 23 by initially identifying similar features and feature locations and then, with this information, identifying repeating geometric patterns within the file data. Next, the geometry engine represents the repetitive patterns as two-dimensional arrays of repeating cells by describing one of the repetitive features and then applying a property to that feature which indicates that it is replicated in a certain number of rows and columns having a defined horizontal and vertical spacing. The advantage of applying compaction at this point in the processing is that repetitive correction feature patterns may also be compacted along with the original pattern data. Consequently, compaction phase 23 greatly reduces the amount of data put in the final data pattern file.

The final compacted data set for the tile is then stored in a pattern file. This pattern file holds all of the data corresponding to all of the tiles once they have been processed through blocks 21–23. The pattern file is typically stored in secondary memory (i.e. disk file) in order to make room in primary memory for computing correction features for the next tile.

As indicated by block 25, the data for the next tile is retrieved and processed through blocks 21–24. When all of the tiles have been processed, the final pattern file contains data representing the entire data pattern having correction features applied to every feature. This final pattern file data may then be processed through other steps prior to using it to create the lithographic mask if necessary.

Figure 4:
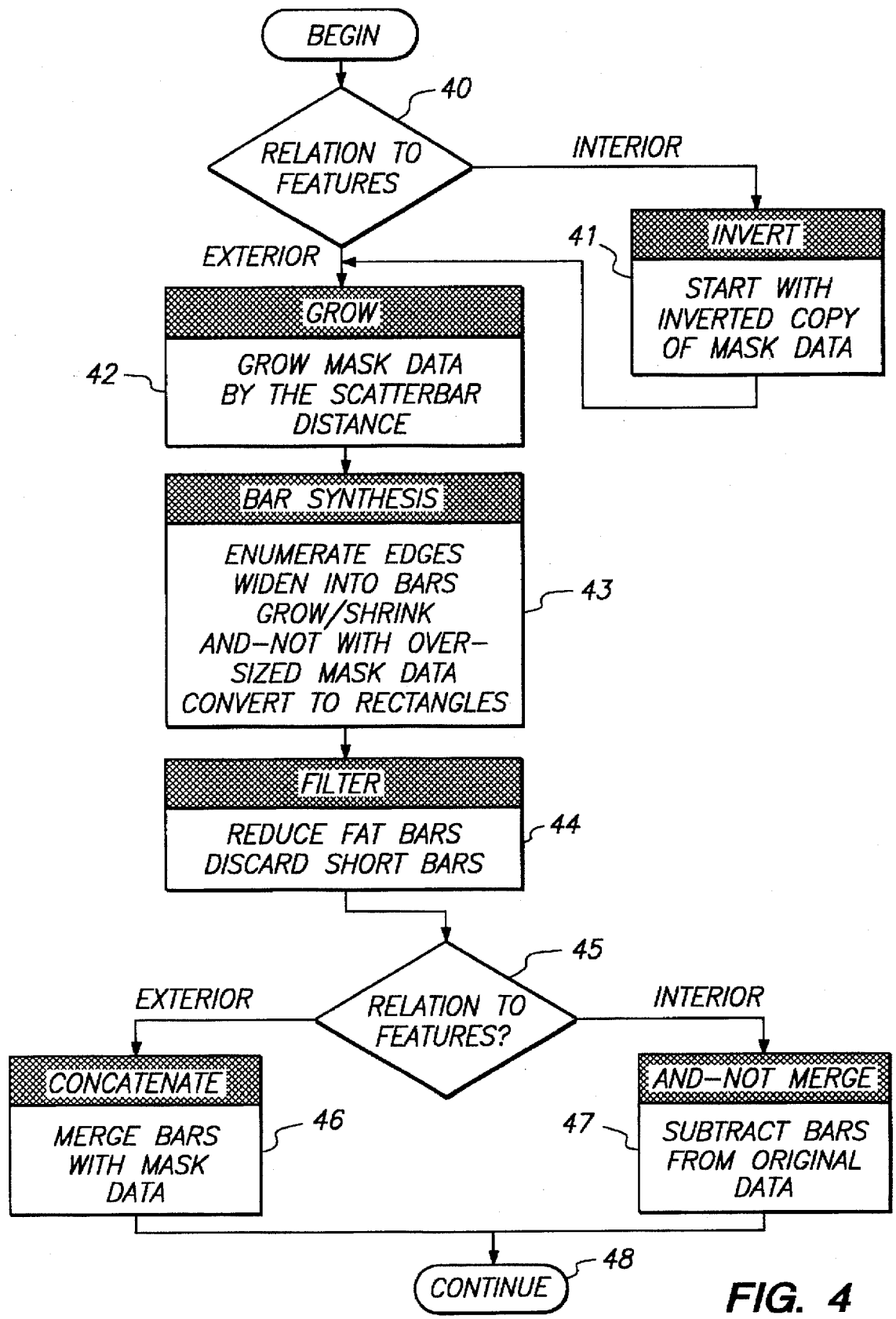
FIG. 4 illustrates a flowchart showing the steps of synthesizing scattering bars according to one embodiment of the present invention.

FIG. 4 is a flowchart illustrating one embodiment of the method for synthesizing scattering bars and anti-scattering bars as described in FIG. 2 (i.e. block 21) according to the present invention. The processing steps apply to dark field mask pattern data. A dark field mask pattern is a pattern in which the feature area is clear and the area surrounding the feature is dark.

Figure 5A:
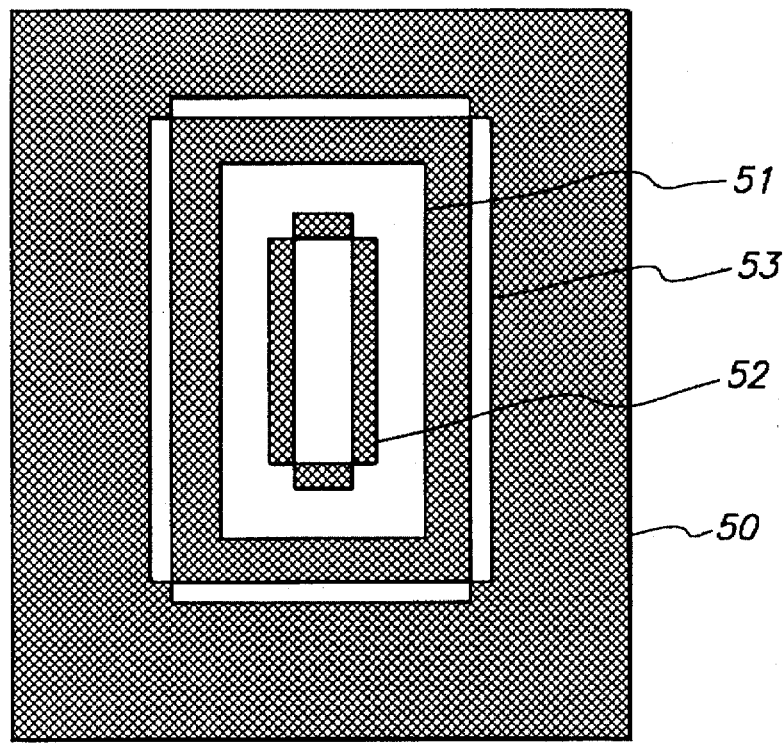
FIG. 5A shows a dark field mask pattern having interior and exterior scattering bar features.
Figure 5B:
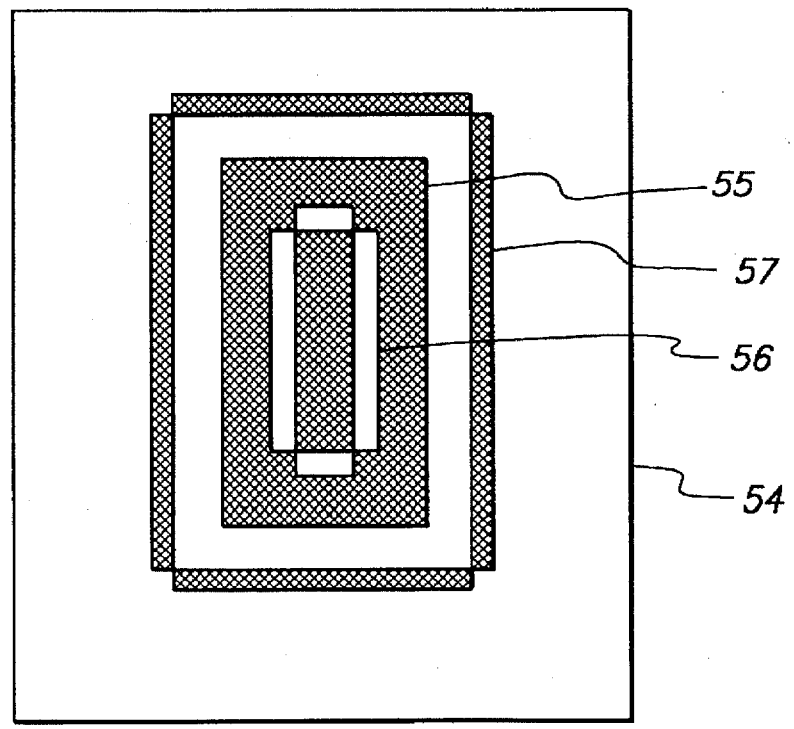
FIG. 5B shows a clear field mask pattern having interior and exterior scattering bar features.

Scattering bars, by definition, are opaque features on the final mask, but may be computed as either "interior" or "exterior" with respect to the original feature data, depending on whether the final mask is dark or clear field. Anti-scattering bars are by definition clear but may also be either interior or exterior to the original feature depending on the type of mask field used. For example, FIG. 5A illustrates a dark field mask pattern 50 having a feature 51 with interior scattering bars 52 and exterior anti-scattering bars 53. Alternatively, FIG. 5B illustrates a clear field mask pattern 59 having a feature 55 with exterior scattering bars 57 and interior anti-scattering bars 56. For purposes of the steps described in FIG. 4, an interior bar is one that resides within the original feature having the opposite opaqueness as the original feature and an exterior bar is one that resides outside of the original feature having the same opaqueness as the original feature.

Block 40 (FIG. 4) determines whether interior or exterior bars are to be computed. If interior bars are computed; the tile pattern data is initially inverted as indicated by block 41, (i.e. the geometry engine makes the clear areas dark and the dark areas clear). If exterior bars are being computed, then the tile data is directly passed to block 42 without inverting the data first.

Next, a grow operation (block 42) is performed. In the case where the data has been inverted to generate interior bar data, a grow is performed on the inverted data.

The oversized data representation from block 42 is then converted into an edge representation in which each edge of the grown feature is enumerated. In this representation, the grown feature data becomes a list of edges—where each edge is represented by the x and y coordinates of its two end points.

Scattering bar synthesis (block 43) is performed by growing each edge (a one-dimensional feature) into a scattering bar (a two-dimensional feature).

FIGS. 6A–E illustrates the geometric operations performed to generate interior scattering bars for an original feature 61 in a clear field mask pattern 60. FIG. 6B illustrates mask pattern 60 after it has been inverted such that feature 61 is clear and the surrounding area is dark. FIG. 6C illustrates pattern 60 after a grow operation wherein clear feature 64 is generated, (note: in a clear field grow operation, the clear areas become smaller, while the dark areas are expanded). FIG. 6D illustrates the edge representation of feature 64 consisting of edges 65–68. Finally, FIG. 6E illustrates expanding each of edges 65–68 into a two-dimensional interior scattering bar.

FIGS. 7A–D illustrate the geometric operations performed to create exterior scattering bars for an original feature 71 in a clear field mask pattern 70. FIG. 7B illustrates mask pattern 70 after a grow operation wherein oversized feature 73 is generated. FIG. 7C illustrates the edge representation of feature 73 including edges 74–77 and FIG. 7D shows the exterior edge bars generated by expanding each of edges 74–77 into a two-dimensional bar.

It should be understood that the method for synthesizing interior and exterior bars is not restricted to the method as described in blocks 41–43 and FIGS. 6 and 7. For instance, instead of inverting feature data and then growing it to synthesize internal bars, feature data can be shrunk (the opposite of a grow operation) to determine edges 65–68 in FIG. 6D followed by expanding the edges into bars. Similarly, external bars may be synthesized by first inverting and then shrinking to determine edges 74–77 in FIG. 7C followed by expanding the edges into bars. Consequently, the general concept behind the technique of the present invention for synthesizing either internal or external correction bars is the displacement of the original feature edges (whether by inverting first and then shrinking or growing or just by shrinking or growing) to the location at which the bar is to be synthesized and then expanding the edge into a bar.

It should also be well understood in the CAD industry that a grow operation in a given direction is equivalent to a shrink operation in the opposite direction.

One other method for synthesizing correction bars is achieved by performing a first grow or shrink operation on feature data (depending on whether interior or exterior bars are being synthesized) to generate first grown/shrunk data. The first grow/shrink operation defines a first set of interior edges of the correction bar being synthesized. Next, a second grow/shrink operation is performed on the first grow/shrink data to generate second grown/shrunk data. The second grow/shrink operation is performed to define a second set of exterior edges. Finally, the first grow/shrink data is geometrically subtracted from the second grow/shrink data to generate a ring of correction bars. This method is shown in FIGS. 8A–8D and 9A–9D. FIGS. 8A–8D show a method for synthesizing exterior bar data for a feature 81 and FIGS. 9A–9D show a method for synthesizing interior bar data for feature 91.

Figure 8A:
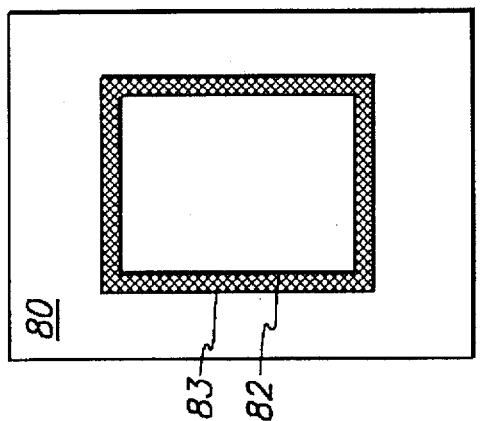
FIGS. 8A–8D illustrate a method for synthesizing exterior bar features according to one embodiment of the present invention.
Figure 8B:
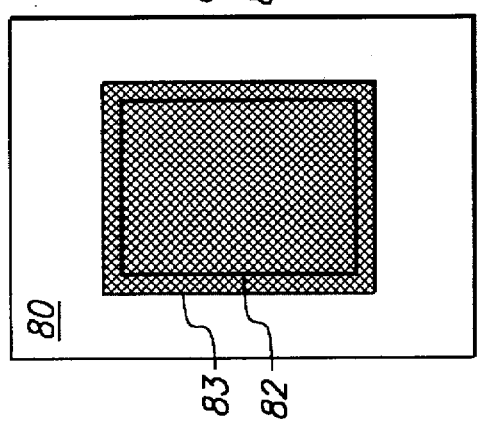
Figure 8C:
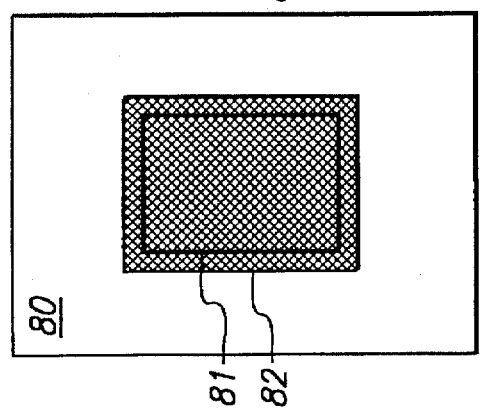
Figure 8D:
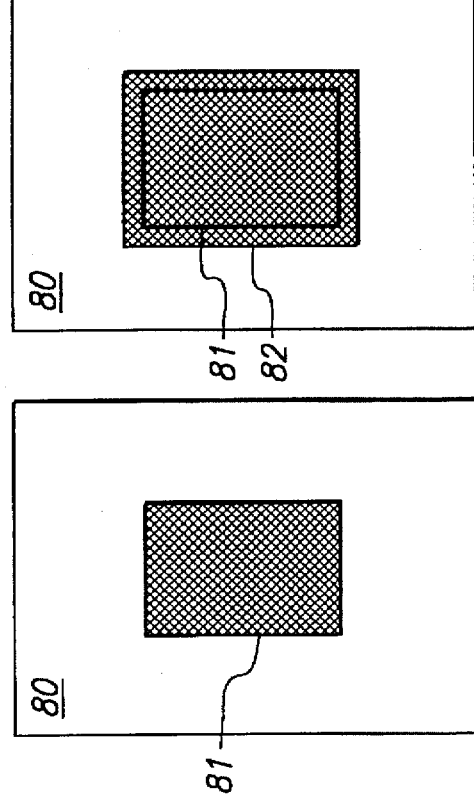

FIG. 8A illustrates a feature 81 and FIG. 8B illustrates a feature 82 after a grow operation is performed on feature 81. FIG. 8C shows a feature 83 which results from a subsequent grow operation on either of features 81 or 82. FIG. 8D shows the synthesized correction feature after feature 82 has been geometrically subtracted from feature 83. This external bar feature would then be geometrically added to feature 81.

Figure 9A:
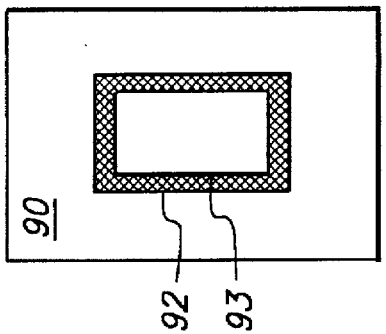
FIGS. 9A–9D illustrate a method for synthesizing interior bar features according to one embodiment of the present invention.
Figure 9B:
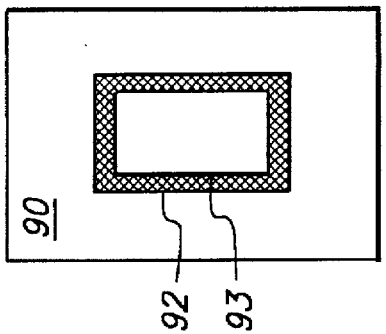
Figure 9C:
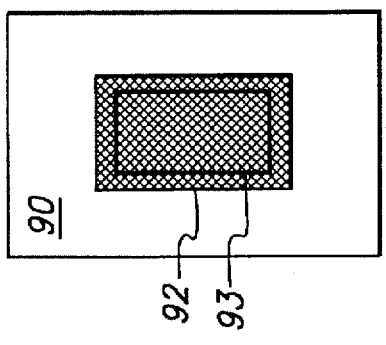
Figure 9D:
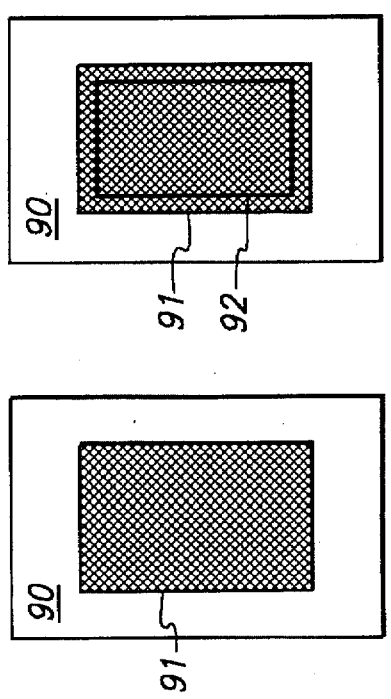

FIG. 9A illustrates a feature 91 and FIG. 9B illustrates a feature 92 after a shrink operation is performed on feature 91. FIG. 9C shows a feature 93 which results from a subsequent shrink operation on either of features 91 or 92. FIG. 9D shows the synthesized correction feature after feature 93 has been geometrically subtracted from feature 92. This internal bar feature would then be geometrically subtracted from feature 91.

After synthesizing the scattering bars (interior or exterior) for each feature in the tile the geometry engine performs the task of filtering out any illegal bar data (block 44). In this step, each bar in the list is checked to see if it is an illegal bar. Illegal bars occur when; 1) two primary features are spaced such that no bar should be synthesized, 2) two primary features are close enough to generate two bars that are spaced too close together, or 3) two primary features generate two overlapping bars resulting in a single fat bar. Once identified, all illegal bars are eliminated. In addition, any other bar fragments generated in the bar synthesis are eliminated. In the case where bars are spaced too close (illegal case 2) or when a fat bar is generated (illegal case 3), a single bar is generated between the two original features that is located equally between the two features, as designated by the design rules.

After eliminating all illegal cases, depending on whether interior or exterior bars are being generated (block 45), either exterior bars are concatenated with the original tile data (block 46), or internal bars are geometrically subtracted from the original tile data to generate modified tile data which includes the internal bar cut-outs (block 47). This geometric subtraction operation is achieved by performing an AND-NOT operation between the internal bar data and the original tile data.

Figure 10:
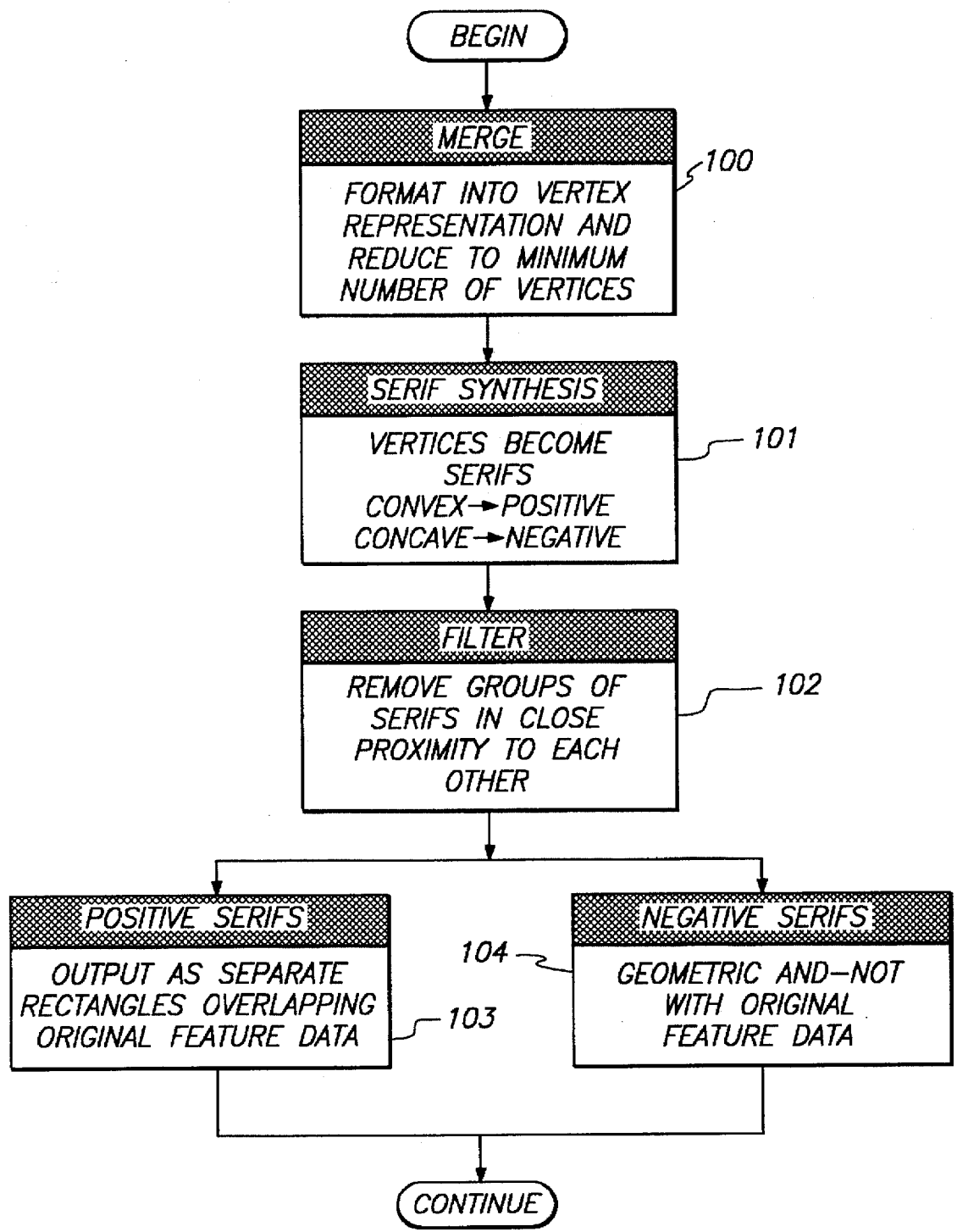
FIG. 10 illustrates a flowchart showing the steps of serif synthesis according to one embodiment of the present invention.

Next, serif synthesis is performed (block 48). FIG. 10 illustrates the steps for synthesizing serifs according to one method of the present invention. Block 100 includes the steps of reformatting the data representation of the original tile data into a vertex representation. In vertex representation, each vertex is enumerated in terms of its spatial coordinates, its type (convex or concave), and its direction. Block 100 also includes a merge step that entails eliminating any redundant vertices in the original data, such as those arising from "construction lines" where two rectangular features abut one another.

Next, serifs are synthesized from this list of vertices (block 101) utilizing software routines provided by the geometry engine. The size and placement of the serifs are dependent on the lithographic design rules. For each convex/concave vertex, a positive/negative serif (see FIG. 1B) is computed. After serif generation, the list of serifs is examined to filter out any serifs that are too close to one another (block 102). The positive serifs are concatenated with (block 103) and the negative serifs are geometrically subtracted from the modified tile data set generated in the previous scattering bar phase (block 104).

Although the elements of the present invention have been described in conjunction with a certain embodiment, it is understood that the invention may be implemented in a variety of other ways. Consequently, it is to be understood that the particular embodiment shown and described by way of illustration is in no way intended to be considered limiting. Reference to the details of this embodiment is not intended to limit the scope of the claims which themselves recite only those features regarded as essential to the invention.

We claim:

1. In a lithographic pattern generation system where a mask pattern having a plurality of features is represented by pattern data wherein each of said plurality of features is enumerated in said pattern data, a method for synthesizing at least one type of correction feature for each of said plurality of features comprising the steps of:

dividing said pattern data into a plurality of data sets wherein each data set contains data corresponding to an overlapping section of said mask pattern;

processing said each data set through at least one correction feature synthesis phase wherein each synthesis phase corresponds to one of said at least one type of correction feature and wherein said each synthesis phase formats said each data set into a data representation that provides information needed to synthesize said synthesis phase's corresponding one type of correction feature, one of said plurality of data sets being processed through said at least one synthesis phase before a next data set of said plurality of data sets is processed through said at least one synthesis phase.

2. The method as described in claim 1 wherein one of said at least one synthesis phase formats said each data set into a vertex data representation and generates a serif type correction feature.

3. The method as described in claim 1 wherein said at least one synthesis phase formats said each data set into an edge data representation and generates a bar type correction feature.

4. The method as described in claim 1 wherein, after said each data set is processed through said at least one synthesis phase, data generated from said at least one synthesis phase along with said each data set is compacted into compacted data.

5. The method as described in claim 1 wherein a first type of digital data storage means is used to store data that is utilized in the step of processing said each data set through said at least one synthesis phase and wherein a second type of digital data storage means is used to store said data generated from said at least one synthesis phase along with said each data set wherein said first type of digital data storage means is faster than said second type of digital data storage means.

6. In a lithographic pattern generation system where a mask pattern having a plurality of features is represented by pattern data, said pattern data being formatted in a non-hierarchical pattern representation where each feature of said plurality of features is enumerated, said each feature having corresponding edges and vertices, a method for synthesizing serif and bar correction features for each feature, said method including the steps of:

1) dividing said pattern data into a plurality of data sets, wherein each data set contains data corresponding to an overlapping section of features in said mask pattern;

2) processing one of said plurality of data sets through a bar synthesis phase wherein said bar synthesis phase formats said one data set's corresponding data into an edge representation and wherein said bar synthesis phase generates interior and exterior bar data for said corresponding edges of said each feature in said one data set, said exterior bar data being geometrically added to said one data set's corresponding data and said interior bar data being geometrically subtracted from said one data set's corresponding data;

3) processing said one data set through a serif synthesis phase wherein said serif synthesis phase formats said one data set's corresponding data into a vertex representation, and wherein said serif synthesis phase generates positive and negative serif data for each of said corresponding vertices of said each feature in said one data set, said positive serif data being geometrically added to said one data set's corresponding data and said negative serif data being geometrically subtracted from said one data set's corresponding data;

4) storing the resultant data from the geometric addition and subtraction operations performed in steps 2 and 3 in a pattern file, said pattern file for storing all of said pattern data having said serif and edge bar correction features applied to it;

5) performing steps 2–4 for another of said plurality of data sets, for the remainder of said plurality of data sets.

7. The method as described in claim 6 wherein, before step 4 said resultant data is compacted into two-dimensional arrays of repeated figures.

8. The method as described in claim 6 wherein before said positive and negative serif data is generated the number of said corresponding vertices of said each feature in said one data set is minimized according to a given set of design rules associated with said lithographic pattern generation system and after said positive and negative serif data is generated any of said positive and negative serif data not in compliance with said given set of design rules is eliminated.

9. The method as described in claim 6 wherein said step of processing said one data set through said bar synthesis phase includes the step of eliminating a first type of said exterior and interior bar data not in compliance with a given set of design rules associated with said lithographic pattern generation system and modifying a second type of said exterior and interior bar data not in compliance with said given set of design rules.

10. In a mask pattern having at least one feature represented by feature data, said at least one feature having associated edges, a method for synthesizing a bar correction feature for at least one of said associated edges, said bar correction feature being spaced a given distance from said at least one of said associated edges according to a given set of design rules associated with said mask pattern, said method including the steps of:

displacing said at least one of said associated edges said given distance;

expanding said at least one displaced edge to generate data corresponding to said bar correction feature having a width equal to a predetermined bar width;

wherein, if said data corresponding to said at least one bar correction feature is an internal bar correction feature with respect to said feature data, said at least one bar correction feature data is geometrically subtracted from said feature data; and wherein, if said data corresponding to said at least one bar correction feature is an external bar correction feature with respect to said feature data, said at least one bar correction feature data is geometrically added to said feature data.

11. In a mask pattern having at least one feature represented by feature data, said at least one feature having associated edges, a method for synthesizing bar correction features for said associated edges, said bar correction features being spaced a given distance from said associated edges according to a given set of design rules associated with said mask pattern, said method including the steps of:

displacing said associated edges said given distance to obtain first displaced feature data;

displacing said first displaced feature data a second distance equal to a predetermined width of said bar correction features to obtain second displaced feature data;

performing a geometric AND-NOT operation between said first displaced feature data and said second displaced feature data to obtain data corresponding to said bar correction features;

wherein, if said data corresponding to said bar correction features corresponds to internal bar correction features with respect to said feature data, said bar correction feature data is geometrically subtracted from said feature data; and wherein, if said data corresponding to said bar correction features corresponds to external bar correction features with respect to said feature data, said bar correction feature data is geometrically added to said feature data.

12. The method as described in claims 10 or 11 further including the step of first inverting said feature data.

13. In a mask pattern having a plurality of features represented by feature data, said mask pattern having clear and opaque areas, said plurality of features having associated edges, a method for synthesizing one of an internal and external bar correction feature for each of said associated edges, said one bar correction feature being spaced a given distance from said each associated edge according to a given set of design rules associated with said mask pattern, said method including the steps of:

1) changing the opaqueness of said opaque and clear areas into the opposite opaqueness for synthesizing said internal bar correction feature;

2) oversizing each of said plurality of features by said given distance to generate oversized feature data, wherein if said each feature corresponds to an opaque area, said opaque area is oversized and wherein if said each feature corresponds to a clear area, said clear area is oversized;

3) formatting said oversized feature data into an edge representation wherein said each associated edge is enumerated by edge data;

4) expanding said edge data to generate data corresponding to one of said internal and external bar correction feature, said one of said internal and external bar correction feature having a width equal to a predetermined bar width;

5) geometrically subtracting said data corresponding to said internal bar correction from said feature data for internal bar synthesis;

6) geometrically adding said data corresponding to said external bar correction feature to said feature data for external bar synthesis.

14. The method as described in claim 13 wherein when a first of said associated edges having a first associated edge bar correction feature is spaced a first distance from a second of said associated edges having a second associated edge bar correction feature, said first and second associated edge bar correction features are eliminated.

15. The method as described in claim 14 wherein when said first and said second edges are spaced a second distance apart, said first associated edge bar correction feature and said second associated edge bar correction feature are combined to form a single edge bar having said width equal to said predetermined edge bar width.

* * * * *